United States Patent
Kim

(10) Patent No.: US 7,151,386 B2
(45) Date of Patent: Dec. 19, 2006

(54) APPARATUS FOR TESTING INTEGRATED CIRCUIT CHIPS

(75) Inventor: Jung-Nam Kim, Suwon-si (KR)

(73) Assignee: Samsung Electronics, Co., Ltd., Gyeonggi-Do (KR)

( * ) Notice: Subject to any disclaimer, the term of this patent is extended or adjusted under 35 U.S.C. 154(b) by 0 days.

(21) Appl. No.: 10/832,285

(22) Filed: Apr. 27, 2004

(65) Prior Publication Data

US 2005/0012515 A1    Jan. 20, 2005

(30) Foreign Application Priority Data

Jul. 18, 2003    (JP)    ..................... 10-2003-0049202

(51) Int. Cl.
*G01R 31/02* (2006.01)
*G01R 31/26* (2006.01)

(52) U.S. Cl. ................... 324/754; 324/765; 324/158.1; 134/32

(58) Field of Classification Search ........ 324/750–765, 324/754; 134/32; 15/301
See application file for complete search history.

(56) References Cited

U.S. PATENT DOCUMENTS

| | | | |
|---|---|---|---|
| 5,220,279 A * | 6/1993 | Nagasawa | ................... 324/754 |
| 6,118,290 A * | 9/2000 | Sugiyama et al. | .......... 324/754 |
| 6,170,116 B1 | 1/2001 | Mizuta | |
| 6,353,221 B1 | 3/2002 | Elings | |
| 6,366,102 B1 * | 4/2002 | Ishimoto | ..................... 324/754 |
| 2002/0149385 A1* | 10/2002 | Miki | .......................... 324/761 |

FOREIGN PATENT DOCUMENTS

| | | |
|---|---|---|
| JP | 10-209232 | 8/1998 |
| JP | 11-054574 | 2/1999 |

* cited by examiner

*Primary Examiner*—Vinh Nguyen
*Assistant Examiner*—Emily Y Chan
(74) *Attorney, Agent, or Firm*—Harness, Dickey & Pierce, P.L.C.

(57) ABSTRACT

A test apparatus, for testing electric properties of an integrated circuit, may include: a housing; a chuck on which an integrated circuit is placed as an object of the testing, the chuck being disposed in the housing; a tester part, having a probe needle, to test electric properties of the object, the tester part being attached to the housing; and a cleaning part to clean the probe needle, the cleaning part being disposed in the housing, and the cleaning part including a supporter, a mounting stand removably/attachably coupled to the supporter, and a polishing pad attached to the mounting stand to polish the probe needle.

22 Claims, 8 Drawing Sheets

APPARATUS FOR TESTING INTEGRATED CIRCUIT CHIPS

PRIORITY STATEMENT

This application claims the priority of Korean Patent Application No. 2003-49202, filed on Jul. 18, 2003 in the Korean Intellectual Property Office, the disclosure of which is incorporated herein in its entirety by reference.

BACKGROUND OF THE INVENTION

To manufacture semiconductor products requires many processes such as a process for manufacturing a pure silicon wafer, a process for forming a plurality of semiconductor chips on the pure silicon wafer, an electrical die sorting (EDS) process for determining whether the semiconductor chips are good or bad, a package process for packaging good semiconductor chips, and a test process for finally testing the packaged semiconductor chips.

Chips determined to be bad via the EDS process are repaired or removed before an assembly process. This reduces the cost of the assembly process and enhances the yield of the overall chip-fabricating process.

Apparatuses for the EDS process are disclosed in U.S. Pat. Nos. 6,118,290, 6,353,221, and 6,170,116. In a typical apparatus for the EDS, a wafer is placed on a chuck. A tester, to which a probe card is connected, is disposed over the chuck. The probe card has probe needles that are electrically interconnected to chips formed on the wafer to check electric properties.

Generally, a chip pad is made of aluminum. When the EDS process is repeatedly carried out, aluminum-containing foreign materials become attached to the end of the probe needle or damage the end of the probe needle due to repeated contact therewith. Thus, a signal is non-uniformly transmitted, which administers a distorted test.

A mounting plate is disposed at one side of a chuck. To remove the foreign materials attached to the probe needle, a polishing pad such as sandpaper is mounted on the mounting plate. After the polishing pad is used for predetermined time, the end of the probe needle is brought into contact with the polishing pad to clean the probe needle.

A polishing pad gradually is consumed through normal use and eventually must be replaced. However, since a mounting plate is fixed to a chuck in a typical apparatus, it is difficult to monitor whether the polishing pad needs to be replaced and a significant amount of time is required for replacing the polishing pad. That is, to replace the polishing pad or check whether the polishing pad should be replaced, the chuck must be moved to a position in which an operator can visually check the polishing pad with his/her eyes. Afterwards, if replacement of the polishing pad is needed, the chuck is unset to expose the polishing pad such that it can be replaced. After replacing the polishing pad, the chuck must be reset before subsequent processes can be performed.

SUMMARY OF THE INVENTION

At least one embodiment of the present invention provides an integrated circuit chip test apparatus operation of which shortens the time required for replacing a polishing pad.

At least one other embodiment of the present invention provides a test apparatus for testing electric properties of an integrated circuit. Such an apparatus may include: a housing; a chuck on which an integrated circuit is placed as an object of the testing, the chuck being disposed in the housing; a tester part, having a probe needle, to test electric properties of the object, the tester part being attached to the housing; and a cleaning part to clean the probe needle, the cleaning part being disposed in the housing, and the cleaning part including a supporter, a mounting stand removably/attachably coupled to the supporter, and a polishing pad attached to the mounting stand to polish the probe needle.

Additional features and advantages of the invention will be more fully apparent from the following detailed description of example embodiments, the accompanying drawings and the associated claims.

BRIEF DESCRIPTION OF THE DRAWINGS

The accompanying drawings are: intended to depict example embodiments of the invention and should not be interpreted to limit the scope thereof; and not to be considered as drawn to scale unless explicitly noted.

DETAILED DESCRIPTION OF THE INVENTION

Figure 1:
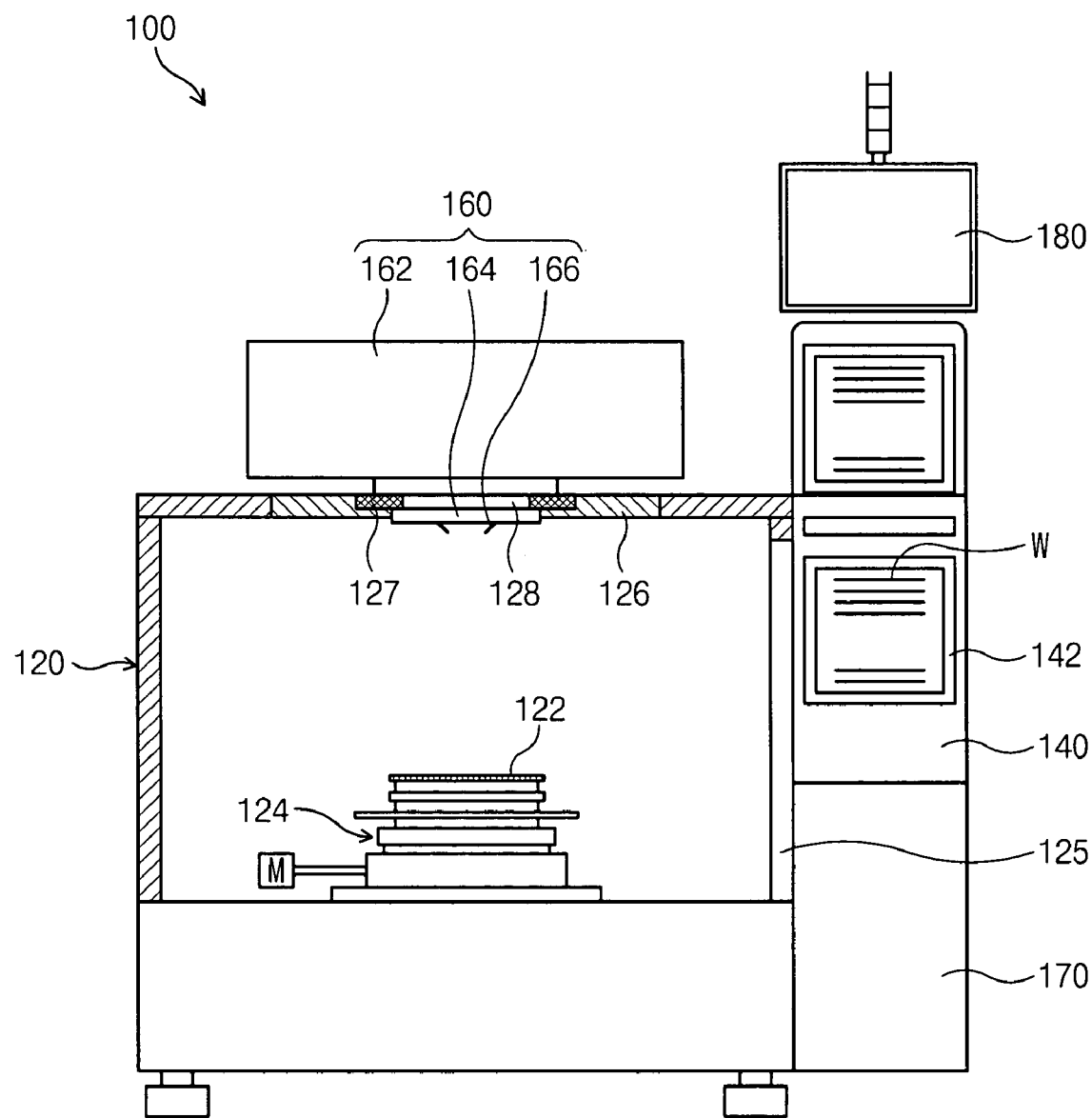
FIG. 1 is a partial cut-away side view of an integrated circuit chip test apparatus according to at least one embodiment of the present invention.

FIG. 1 is a partial cut-away side view of an integrated circuit chip test apparatus 100 according to at least one embodiment of the present invention. Apparatus 100 includes a housing 120, a loader part 140, a tester part 160, and a cleaning part (20 of FIG. 2). The housing 120 offers a space in which an EDS (again, electrical die sorting) process (for testing chips formed on a semiconductor substrate such as a wafer W) is carried out. An openable headplate 126 is installed on a top surface of the housing 120, and a door 128 is installed at a front side thereof. An opening 125 is formed at a lateral side of the housing 120 that is adjacent to the loader part 140. A chuck 122 is installed in the housing 120 and may be moved to a wafer-loading position through the opening 125.

A wafer W to be tested is placed on the chuck 122 installed in the housing 120. The chuck 122 can be moved horizontally, vertically, and rotatably by a chuck driving part 124. During the test, the chuck 122 can be horizontally and rotatably moved to transfer the wafer W to a position aligned underneath a probe needle 166. Thereafter, the chuck 122 can be vertically moved to put a chip pad formed on the wafer W in contact with the probe needle 166. In the chuck 122, a heater (not shown) may be installed to thermally expand the wafer W before the test process.

The loader part 140 loads/unloads (transfers) the wafer W, from/to a cassette 142, to/from the chuck 122. The cassette 142 can be disposed at one side in the loader part 140 to accommodate wafers W, and an arranging part (not shown) can be disposed at the other side therein to arrange the wafers W. A transfer arm (not shown) can be installed at the center of the loader part 140. The transfer arm can transfer wafers W from the cassette 142 to the arranging part and can transfer the arranged wafers W from the arranging part to the chuck 122. A chuck-driving part 124 for moving the chuck 122 and an arm-driving part (not shown) for moving the transfer arm disposed at the loader part 140 may be controlled by a controller 170. An operator may manipulate the controller 170 via an operator interface referred to here as a handle panel 180.

The tester part 160 tests electric properties of chips formed on the wafer W and has tester circuitry (not shown), a test head 162, and a probe card 164. The test head 162 can be installed over the housing 120 so as to be rotatable. The probe card 164 can be fixed onto the opening 128, which is formed at the center of the headplate 126, through an insertion ring 127. The probe needles 166 of the probe card 164 are electrically interconnected to the tester head 162. An electrical signal is transmitted from the tester circuitry through one of the probe needles 166 to a chip formed on the wafer W, and a signal including a test result for the electric properties of the chip is transmitted back to the tester circuitry. The tester circuitry electrically evaluates the respective chips, based on the signal including the test result.

As noted above, since the chip pad is made of aluminum, consequently aluminum-containing foreign materials gradually can become attached to the end of (and so progressively contaminate) the probe needle 166 when the EDS process is repeatedly carried out. Repeated use of the probe needle 166 causes the end of the probe needle 166 to be damaged. Therefore, the transmission of a signal through the end of the probe needle 166 gradually becomes non-uniform, which can administer a distorted test. As a result, it is necessary to clean the probe needle 166 after performing the test a number of times corresponding to a cleaning interval.

Figure 2:
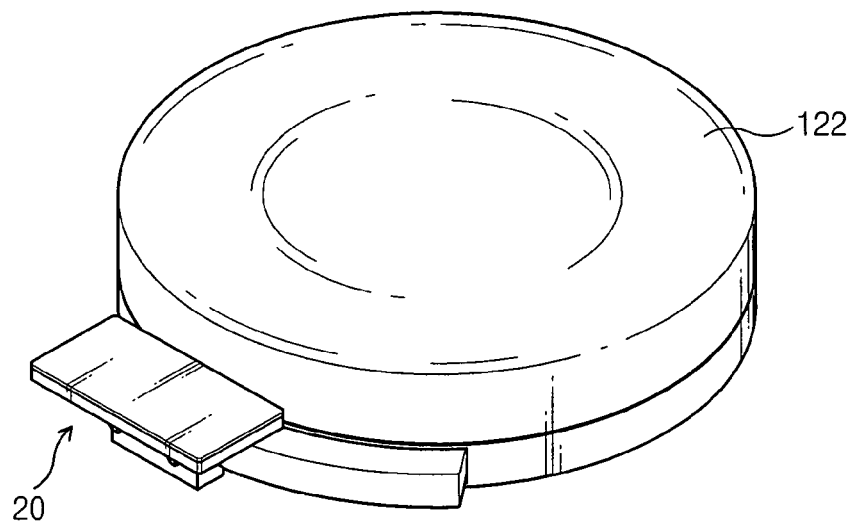
FIG. 2 is a perspective view of a chuck to which a cleaning part is connected, according to at least one embodiment of the present invention.

FIG. 2 is a perspective view of chuck 122 and cleaning part 20, according to at least one embodiment of the present invention. Referring to FIG. 2, the cleaning part 20 is fixedly coupled to the chuck 122. Therefore, the cleaning part 20 is moved in conjunction with the chuck 122 by the chuck driving part 124. In other words, the cleaning part 20 can be vertically or horizontally moved to polish the probe needle 166 by the chuck driving part 124. Alternatively, the cleaning part 20 may be disposed separately from the chuck 122, and a cleaning driving part for horizontally and vertically moving the cleaning part 10 may be installed in the housing 120.

Figure 3:
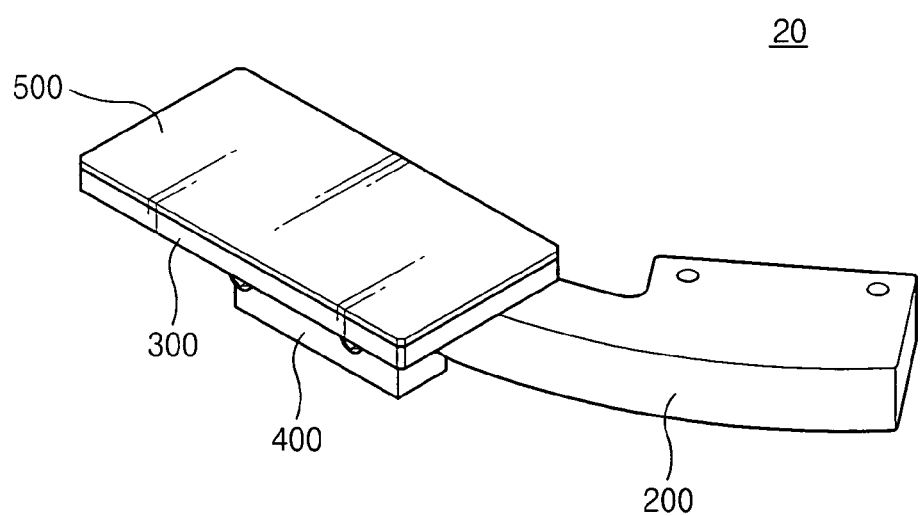
FIG. 3 is a perspective view of the cleaning part of FIG. 2, according to at least one embodiment of the present invention.
Figure 4:
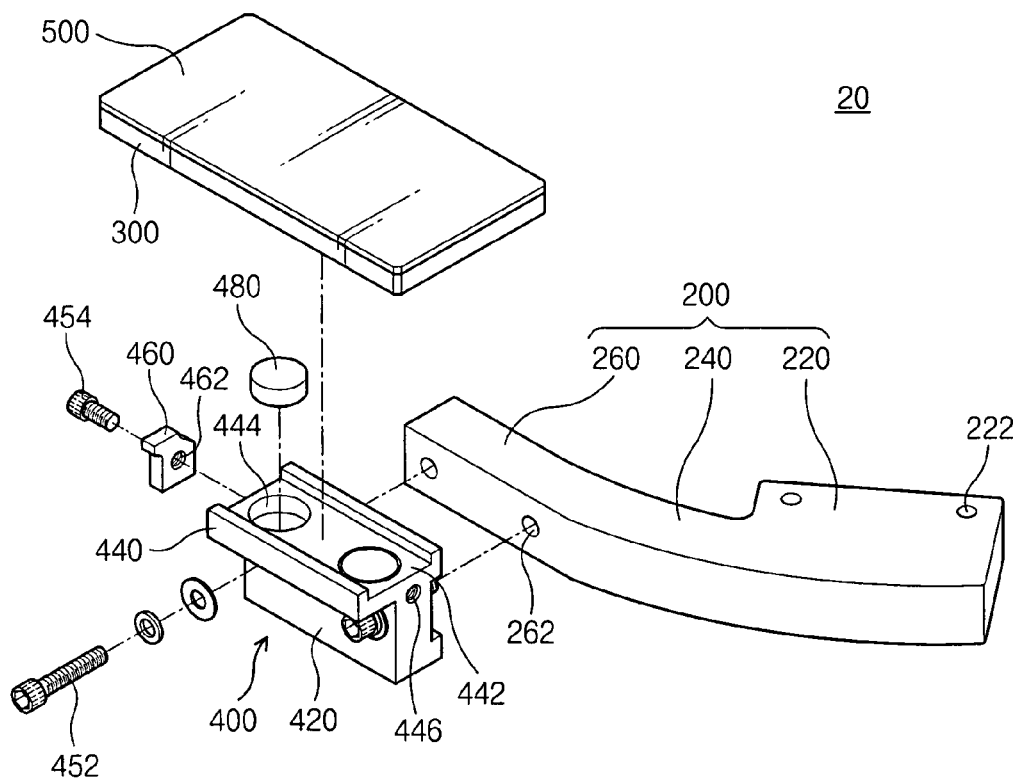
FIG. 4 is an exploded view of FIG. 3.

FIG. 3 is a perspective view, and FIG. 4 is an exploded view, of the cleaning part 20. Referring to FIG. 3 and FIG. 4, the cleaning part 20 has a coupler 200, a mounting stand 300, a supporter 400, and a polishing pad 500. The components 200, 300 and 400 together can alternatively be described as a type of cradle. Also, the components 200 and 400 together can alternatively be described as a type of perch arrangement.

The coupler 200 fixes the cleaning part 20 to a structure in the housing 120, for example, to the chuck 122, e.g., at a side of the chuck 122.

The coupler 200 can be, e.g., in the form of a rod rounded in a length direction and having a first fixing part 220, a middle part 240, and a second fixing part 260. The first fixing part 220 can be a front side of the coupler 200 that can be coupled to the chuck 122. A plurality of screw holes 222 can be formed in the first fixing part 220. The second fixing part 260 can be at a rear side of the coupler 200 that can be coupled to the supporter 400. A plurality of screw holes 262 can be formed in a lateral side of the second fixing part 260. The middle part 240 is disposed between the first and second fixing parts 220 and 260 and may have the same curvature radius as a circular arc of the chuck 122.

The coupler 200 can be made, e.g., of a heat resistant material having poor thermal conductivity. Therefore, it is possible to prevent heat from damaging the coupler 200 and/or being transferred to the polishing pad 500 through the coupler 200 when the chuck 122 is heated at a high temperature by a heater. For example, the coupler 200 may be made of a ceramic material.

The supporter 400 supports the mounting stand 300 and is fixedly coupled to the coupler 200. The supporter 400 has a guide part 440 and a connecting part 420. The guide part 440 can be connected to the mounting part 300. The connecting part 420 can extend downwardly from a lower portion of the guide part 440 and can be fixedly connected to (e.g., held in compression against) the connecting part 200. A plurality of holes 424 can be formed at a lateral side of the connecting part 420. A compressing member, e.g., a screw, 452 can be inserted into the hole 424 and the screw hole 262 to fix the supporter 400 against the coupler 200.

Figure 5:
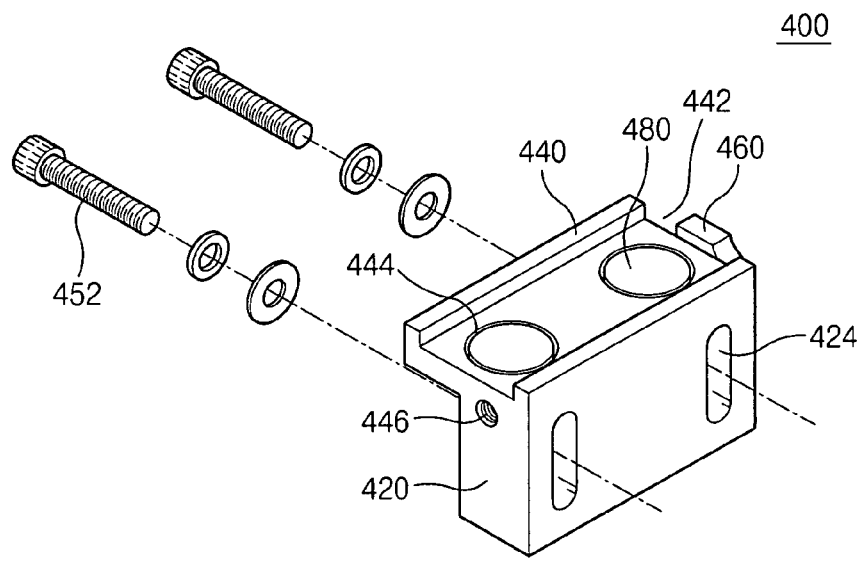
FIG. 5 is a perspective view of an alternative version of the supporter that is a component of the connecting part of FIGS. 2–4, according to at least one other embodiment of the present invention.

FIG. 5 is a perspective view of a supporter 400' (an alternative version of the supporter 400) that is a component of the cleaning part 20, according to at least one other embodiment of the present invention. Referring to FIG. 5, the hole 424' formed at the connecting part 420 can have a shape resembling a vertical slit. A position of the screw 452 inserted into the slit 424' is controlled to regulate a position of the coupler 200 relative to the supporter 400'. That is, a height of the supporter 400 can be regulated according to a position at which the screw 452 is inserted into slit 424' between (and including) a maximum upper position and a maximum lower position of the slit 424'. Thereafter, the screw 452 is coupled to the screw hole 262 formed in the second fixing part 260 to fix the supporter 400 against the coupler 200.

Figure 6A:
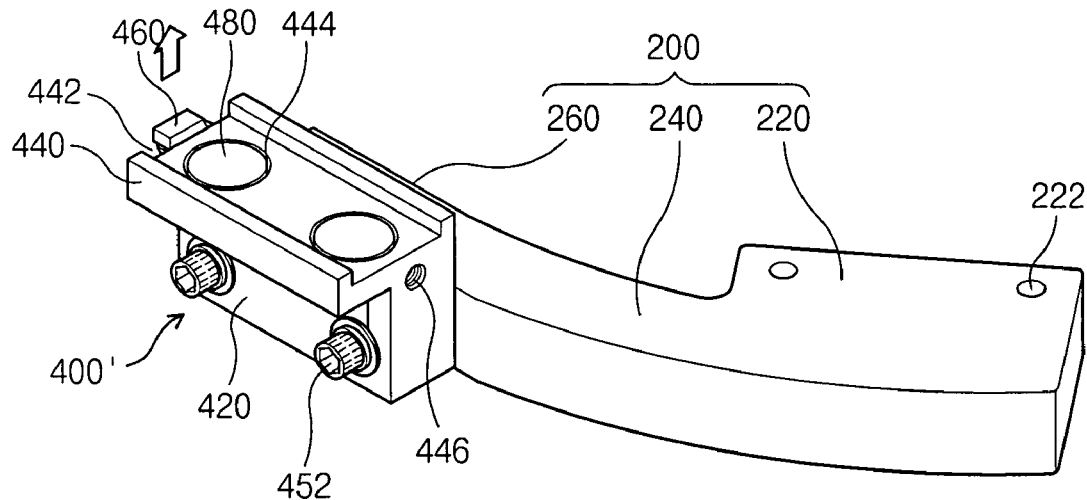
FIG. 6A and FIG. 6B are perspective views showing two of the various arrangements that the supporter and coupler of FIG. 4 can be made to adopt.
Figure 6B:
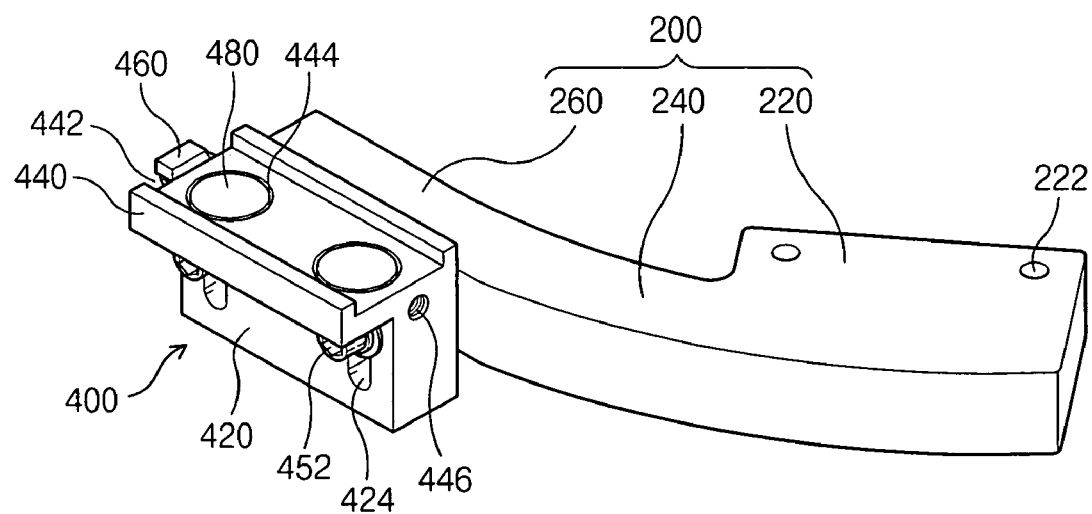

FIGS. 6A and 6B are perspective views showing different two of the various arrangements that the supporter 400' and the coupler 200 can be made to adopt. Adoption of the maximum lower position of the slit 424 is shown in FIG. 6A and adoption of the maximum upper position of the slit 424 is shown in FIG. 6B.

When the cleaning process is carried out, the cleaning part 20 (again) is moved by the chuck driving part 124. Therefore, the supporter 400 should be coupled to the coupler 200 at a precisely determined position. If the supporter 400 is not connected to the coupler 200 at the precise position, there results a difference between an actual position of the polishing pad 500 as it is attached to the mounting stand 300 (which is connected to the supporter 400) and its expected position that has been inputted to the controller 170 (an initially set position). Due to the position difference, the probe needle 166 could be abnormally cleaned or damaged during the cleaning process. As an alternative to mounting the supporter 400 so precisely, the support 400 can be mounted less precisely if (subsequent to the mounting) a calibration process is then performed. Such a calibration would provide the actual position of the supporter 400 to the controller 170.

Figure 7:
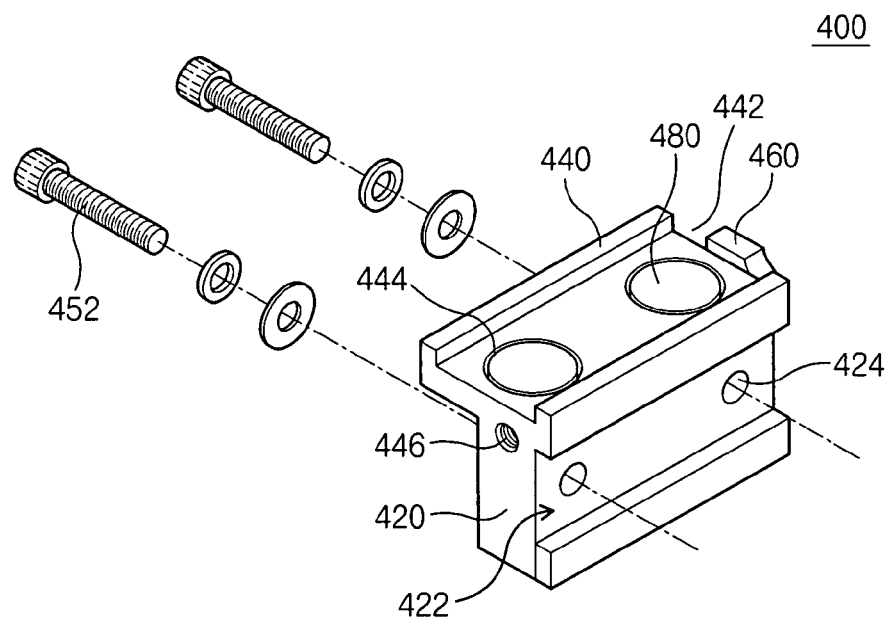
FIG. 7 is a perspective view of the supporter of FIGS. 2–4, according to at least one embodiment of the present invention.
Figure 8:
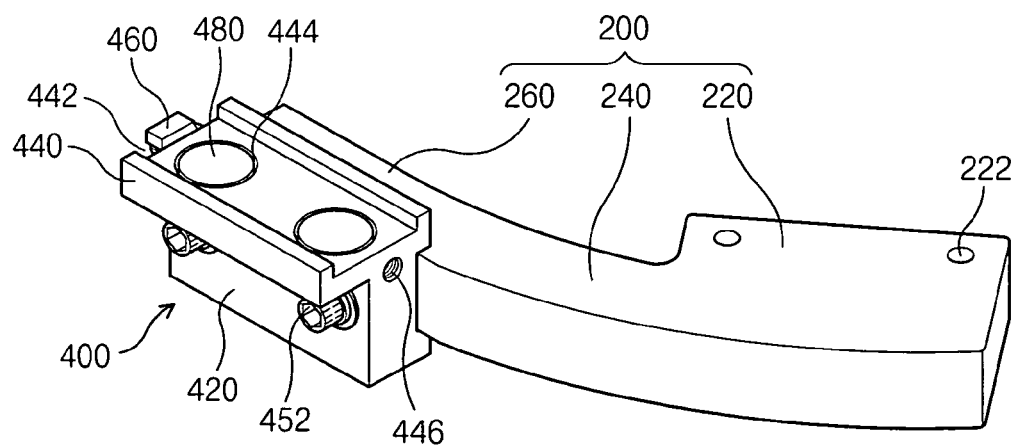
FIG. 8 is a perspective view showing the supporter of FIG. 7 connected to the coupler of FIGS. 3–4.

FIG. 7 is a perspective view of supporter 400 according to at least one other embodiment of the present invention. FIG. 8 shows the supporter 400 of FIG. 7 connected to the coupler 200. Referring to FIG. 7, an insertion groove 422 is formed at a supporter 400. The second fixing part 260 of a coupler is partially inserted into the insertion groove 422. For simplicity, a lateral side of the second fixing part 260 inserted into the insertion groove 422 can be straight. To fix the supporter 400 to the coupler 200, the supporter 400 is positioned to receive the lateral side of the second fixing part 260 of the coupler in the insertion groove 422, as shown in FIG. 8. The supporter 400 can be held against the coupler 200 by a compression arrangement. For example, holes 424 formed in the connecting part 420, of the coupler 200 can be screw holes. Thereafter, a coupling member, e.g., a screw, can be inserted into the hole 424 (formed at the connecting part 420 of a supporter 400) and a screw hole 262 (formed at the second fixing part 260 of the coupler 200) to couple parts 400 and 200 to each other. The second fixing part 260 can be made to fit snugly into the insertion groove 422 so that the supporter 420 repeatably can be disposed at a substantially the same height relative to the coupler 200.

In the case where the supporter 400' of FIG. 5 is used, a relative position between the supporter 400' and the coupler 200 may be advantageously regulated. In contrast, for the case where the supporter 400 of FIG. 7 is used, the supporter 400 may be easily coupled to the coupler 200 at a high speed so as to place the polishing pad 500 at a position assumed by the controller 170.

The polishing pad 500 of the cleaning part 20 can be moved into direct contact with the end of the probe needle 166 (to polish the probe needle 166), and is attached to the mounting stand 300. The polishing pad 500 may be, e.g., sandpaper.

Figure 9:
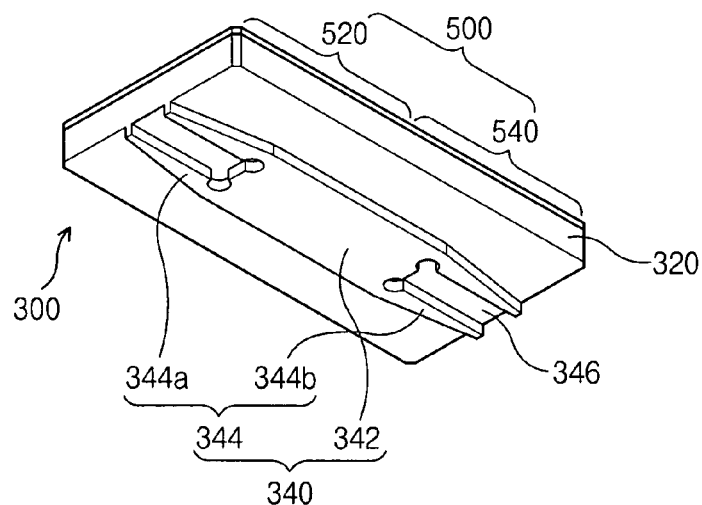
FIG. 9 is a perspective view of a mounting stand, according to at least one embodiment of the present invention.

FIG. 9 is a perspective diagram of the mounting stand 360, according to at least one embodiment of the present invention. Referring to FIG. 9, the mounting stand 300 has an attaching part 320 and a slider part 340. The polishing pad 500 is attached to the attaching part 320. The attaching part 320 can take the form of a rectangular parallelepiped having a flat top surface and can be made of a material that would not damage the probe needle 166 in the case of an unintentional amount of contact during a cleaning process. To facilitate the ease with which an operator can check whether the polishing pad 500 should be replaced and (if need be) can replace the polishing pad 500, the mounting stand 300 is configured to be removable while the chuck 122 or other structures are maintained in a normal position and/or setting. In other words, the mounting stand 300 is removable/attachable from/to the supporter 400, which can reduce or eliminate the need to move the chuck 122 out of a normal position.

To facilitate removing/attaching the mounting stand 300 from/to the supporter 400 at high speed, the slider part 340 extends downwardly from a bottom side of the attaching part 320, and the supporter 400 has a guide part (or, in other words, an arrangement of rails) 440 for guiding the movement of the sliding part 340. The mounting part 300 is coupled to the guide part 440.

The slider part 340 has a central portion 342 and lateral portions 344a and 344b. The central portion 342 is centrally disposed and has a regular width. Each of the lateral portions 344 extends from the central portion 342. Beginning at a proximal end that joins the central portion 342, each lateral portion 344i tapers in width progressively toward a distal end thereof. An insertion passage (also referred to as a pocket groove) 346 is formed at the center of the respective lateral portions 344. When the slider part 340 is moved, a stopper 460 (to be discussed in more detail beow) slidably moves along (and so is inserted into or received in) the insertion plassage 346.

Since the slider part 340 of the mounting stand has symmetrical lateral portions 344, an operator may select either the lateral portion 344a or 344b to be inserted into the guide groove 442. Thus, if the mounting stand 300 is connected with the supporter 400 so as to the first lateral portion 344a of the slider part 340 into the guide groove 442, then the movement of the chuck driving part 124 can be controlled such that only a part of the polishing pad 500 contacts the probe needle 166 during the cleaning process, that part being a first portion 520 of the polishing pad 500. Thereafter, if the second lateral portion 344b of the slider part 340 is inserted into the guide groove 442, a second portion 540 of the polishing pad 500 can be brought into contact with the probe needle 166. This can extend the effective lifetime of the polishing pad 500.

Returning to FIG. 5, the guide groove 442 can be formed at a top surface of the supporter 400' (or similarly support 400) to guide the movement of the slider part 340 of the mounting part. The guide groove 442 can be formed to have straight sides and be of the same width as the central portion 342 of the slider part 340. From one end to the other end of the guide groove 442, the guide groove 442 can have a regular width. Since the width of the lateral portions 344a and 344b is gradually narrower form the central portion 342 of the slider part 340, the slider part 340 may be easily inserted into the guide groove 442. Alternatively, the taper can be implemented in the guide groove 442 instead of the lateral portions 344a and 344b.

The supporter 400 has the stopper 460 to restrict the range of motion of the slider part 340. The stopper 460 can be mounted at one end (hereafter, the restricted end) of the guide part 440 to protrude over a bottom side of the guide groove 442 and so obstruct the restricted end of the guide groove 442. The stopper 460 may be fixedly coupled to the supporter 400, e.g., by a screw 454 inserted into a screw hole 462 (see FIG. 4) formed in the stopper 460 and a screw hole 446 formed in the guide part 400 of the supporter 400'. The stopper 460 may be selectively coupled to either end of the of the guide part 440. Alternatively, a guide groove (similar to 442) may be formed into the bottom side of the mounting stand 300 and the supporter 400 may be formed to include a slider part 340 that is to be inserted into the guide groove in the stopper 460.

Movement between the mounting stand 300 and the supporter 400 should be restrained when the cleaning part 20 is moved. Such restraint can be provided, e.g., by a magnetic coupling. Circular recesses 444 are formed in the guide groove 442 at the central portion of the guide part 440, as shown in FIG. 4, and round magnets 480 are inserted (and attached to) the recesses 444. Correspondingly, the mounting stand 300 is made of a material that is attracted by a magnet 480. For example, the mounting part 300 can be made of metal, e.g., a hard metal such as steel. Although it has been described that the magnet 480 is installed in the supporter 400 and the mounting stand 300 is made of steel, alternatively the magnet 480 may be installed in the mounting stand 300 and the supporter 400 can be made of a material attracted by a magnet, or magnets 480 may be installed in both the mounting stand 300 and the supporter 400.

A lateral portion 344a or 344b of the slider part 340 is inserted into the guide groove 442 from one side of the guide part 440 in order to mount the mounting stand 300 on the supporter 400. During insertion, the slider part 340 is slidably moved along the guide groove 442 until the stopper 460 located at the other end of the guide groove 442 is received in (or engages) the insertion passage 346 of the lateral portion 344. When the stopper 460 engages the end of the insertion passage 346, the movement of the mounting stand 300 is restricted.

Figure 11:
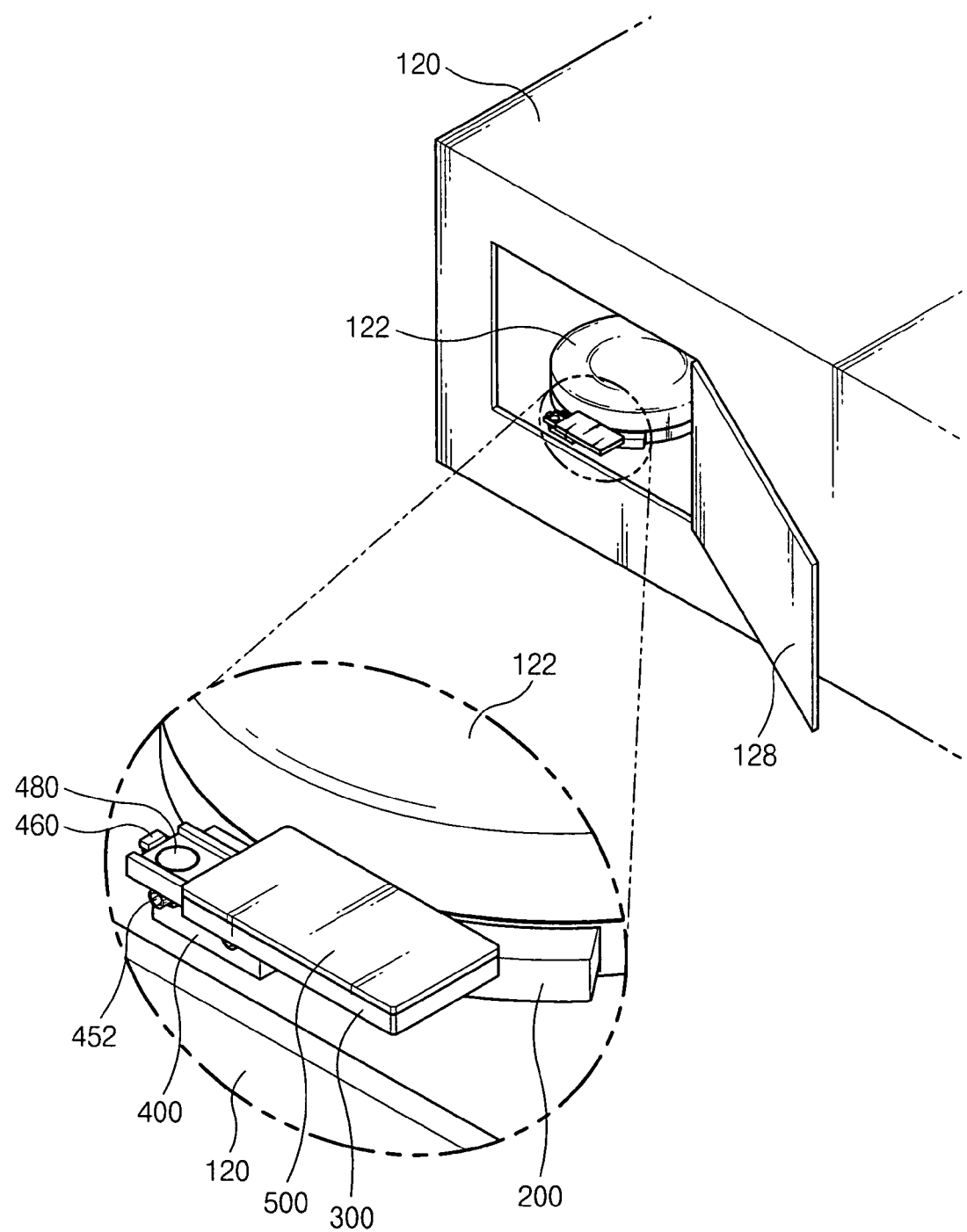
Figure 12:
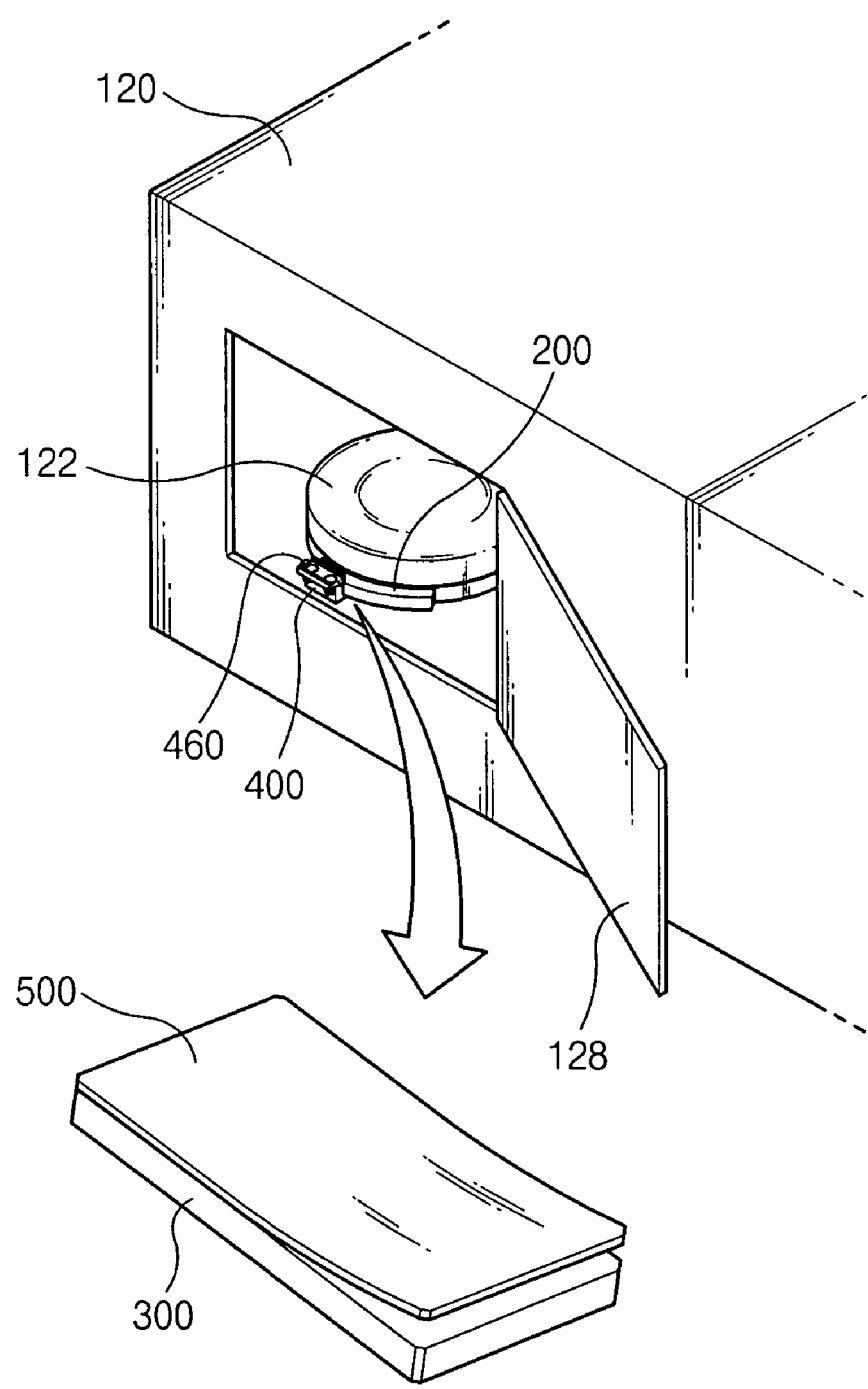

The steps of replacing the polishing pad 500 will now be described with reference to the perspective views of FIG. 10 through FIG. 12, according to at least one embodiment of the present invention.

Figure 10:
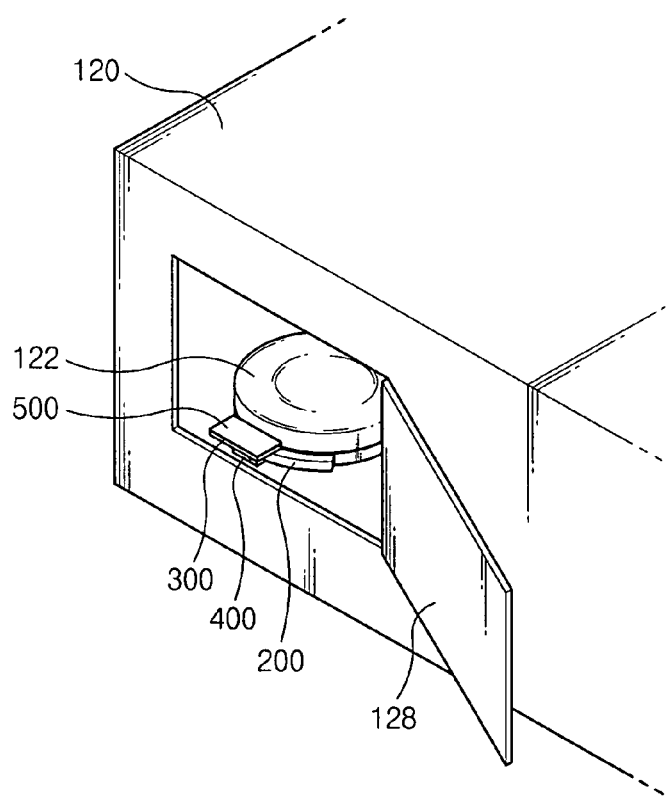
FIG. 10 through FIG. 12 are perspective views showing some of the steps of replacing a polishing pad in the integrated circuit chip test apparatus, according to at least one embodiment of the present invention.

In order to determine whether the polishing pad 500 needs to be replaced, an operator opens a door 128 formed at a front side of the housing 120, as shown in FIG. 10. Thereafter, the operator can manually displace the mounting stand 300 (as shown in FIG. 11) such that the slider part 340 is slidably moved along the guide groove 442 until the mounting stand 300 can be removed from the supporter 400 (as shown in FIG. 12). When the mounting stand 300 has been removed from the supporter 400, the operator can withdraw the mounting stand 300 from the housing 120. Then, the operator can visually inspect the polishing pad 500 in order to determine whether to replace the polishing pad 500. If the operator determines that the polishing pad 500 should be replaced, he/she removes the old polishing pad 500 from the mounting stand 300 and attaches a new polishing pad 500 to the mounting pad 300. After opening the door 128 (assuming it had been closed in the meantime), the operator can insert the slider part 340 into the guide groove 442 until the movement of the mounting stand 300 is stopped by the stopper 460.

According to the invention, an operator can quickly mount a cleaning part on a chuck so as to precisely dispose a polishing pad at a mounting position. Without having to move the chuck from what is typically a normal position, the operator nevertheless easily can detach the mounting stand (to which the polishing pad is attached) and withdraw it from the housing. Therefore, it is possible to significantly shorten time required for checking whether the polishing pad needs to be replaced and/or the time required for replacing the polishing pad. Since the mounting stand and a supporter are coupled to each other by a magnetic force, a special decoupling/coupling operation is not needed when the mounting stand is removed/attached from/to the supporter disposed in the housing.

The invention being thus described, it will be obvious that the same may be varied in many ways. Such variations are not to be regarded as a departure from the spirit and scope of the invention, and all such modifications are intended to be included within the scope of the invention.

What is claimed is:

1. A test apparatus for testing electric properties of integrated circuits, the test apparatus comprising:
   a housing;
   a chuck on which an integrated circuit is placed as an object of the testing, the chuck being disposed in the housing;
   a tester part, having a probe needle, to test electric properties of the integrated circuit, the tester part being attached to the housing; and
   a cleaning part to clean the probe needle, the cleaning part including
      a supporter,
      a mounting stand removably/attachably coupled to the supporter, and
      a polishing pad attached to the mounting stand to polish the probe needle,
      wherein one of the supporter and the mounting stand has at least one magnet installed thereon, and the other of the supporter and the mounting stand is made of a material attractable by at least one magnet.

2. The test apparatus as claimed in claim 1, wherein the mounting stand is slidably movable with respect to the supporter.

3. The test apparatus as claimed in claim 2, wherein:
   the mounting stand includes
      an attaching part to which the polishing pad is attached, and
      a slider part downwardly projecting from a bottom side of the attaching part; and
   the supporter includes
      a guide part into which is formed a guide groove to slidably receive the slider part.

4. The test apparatus as claimed in claim 3, wherein the supporter further includes a stopper to restrict a range of sliding movement of the slider part such that the mounting stand can be repeatedly coupled to the supporter at substantially a same position.

5. The test apparatus as claimed in claim 4, wherein the slider part comprises:
   a central portion having a uniform width; and
   a lateral portion extending from the central portion, a proximal end of the lateral portion coupling to the central portion, the lateral portion tapering in width out to a distal end thereof.

6. The test apparatus as claimed in claim 5, wherein there are two lateral portions formed at both sides of the central portion, respectively.

7. The test apparatus as claimed in claim 5, wherein the stopper is disposed to obstruct a restricted end of the guide groove, and a pocket groove is formed in the lateral portion of the slider part such that sliding movement of the slider part when received in and relative to the guide groove is restricted when the stopper is received by the pocket groove.

8. The test apparatus as claimed in claim 3, wherein the at least one magnet is installed at the guide part, and the mounting stand is made of a material attractable by the at least one magnet.

9. The test apparatus as claimed in claim 8, wherein at least one recess is formed in a bottom side of the guide groove, and the at least one magnet is disposed therein, respectively.

10. The test apparatus as claimed in claim 3, wherein:
    the cleaning part further includes a coupler to couple the cleaning part to a lateral side of the chuck; and
    the supporter further includes a connecting part that extends from the guide part and that is attached to the coupler.

11. The test apparatus as claimed in claim 10, wherein the supporter has a groove into which at least a portion of the coupler is inserted.

12. The test apparatus as claimed in claim 11, wherein the groove formed at the lateral side of the supporter has substantially the same width as the coupler inserted into the groove.

13. The test apparatus as claimed in claim 10, wherein the coupler and the supporter are coupled to each other by a compressing member inserted into a corresponding hole formed in a lateral side of the coupler and a slit-type hole formed at a lateral side of the supporter, and a relative position of the coupler and the supporter is regulated according to a position of the coupling member inserted into the slit-type hole.

14. The test apparatus as claimed in claim 1, wherein the at least one magnet is a permanent magnet.

15. A test apparatus for testing electric properties of integrated circuits, the test apparatus comprising:
a housing having a lateral side at which a door is formed;
a chuck on which an integrated circuit is placed as an object of the testing, the chuck being movable at least vertically and horizontally;
a tester part, having a probe needle, to test electric properties of the integrated circuit, the tester part being attached to the housing; and
a cleaning part to clean the probe needle, the cleaning part being disposed in the housing, and the cleaning part including
a coupler fixedly coupled to the chuck,
a supporter fixedly coupled to the coupler, and
a mounting stand to which is attachable a polishing pad for use upon the probe needle, the mounting stand being removably/attachably coupled to the supporter,
wherein one of the supporter and the mounting stand has at least one magnet installed thereon, and the other of the supporter and the mounting stand is made of a material attachable by at least one magnet.

16. The test apparatus as claimed in claim 15, wherein the supporter is coupled to the mounting stand by a magnetic force.

17. The test apparatus as claimed in claim 16, wherein:
the cleaning part further includes a magnet,
the supporter has a top surface in which is formed a magnet-receiving recess into which is disposed the magnet; and
the mounting stand is made of a material attractable by the magnet.

18. The test apparatus as claimed in claim 15, wherein:
the mounting stand includes a slider part downwardly protruding from a bottom side thereof; and
a guide groove is formed at a top surface of the supporter to receive, and so guide the movement of, the slider part.

19. The test apparatus as claimed in claim 15, wherein the supporter has a groove that is formed at a lateral side thereof and has the same width as the coupler, and at least a portion of the coupler is inserted into the groove formed at the lateral side of the supporter.

20. The test apparatus as claimed in claim 15, wherein the at least one magnet is a permanent magnet.

21. A test apparatus for testing electric properties of integrated circuits, the test apparatus comprising:
a housing having a lateral side at which a door is formed;
a chuck on which an integrated circuit is placed as an object of the testing, the chuck being moveable vertically and horizontally;
a tester part, having a probe needle, to test electric properties of the integrated circuit, the tester part being attached to the housing; and
a cleaning part to clean the probe needle, the cleaning part being fixedly coupled to the chuck, the cleaning part including
a coupler connected with the chuck;
a supporter having a lateral side at which an insertion groove is formed and an upper side at which a guide groove is formed, the coupler being is inserted into the insertion groove; and
a mounting stand to which is attachable a polishing pad for use upon probe needle, the mounting stand being slidably moveable along the guide groove and coupled to the supporter by a magnetic force,
wherein one of the supporter and the mounting stand has at least one magnet installed thereon, and the other of the supporter and the mounting stand is made of a material attachable by the at least one magnet.

22. The test apparatus as claimed in claim 21, wherein the at least one magnet is a permanent magnet.

* * * * *